United States Patent
Okuda et al.

(10) Patent No.: US 10,243,203 B2
(45) Date of Patent: Mar. 26, 2019

(54) HYDROGEN STORING ALLOY AND PRODUCTION METHOD THEREOF

(71) Applicants: GS Yuasa International Ltd., Kyoto-shi, Kyoto (JP); XIAMEN TUNGSTEN CO., LTD., Xiamen, Fujian (CN)

(72) Inventors: Daisuke Okuda, Kyoto (JP); Manabu Kanemoto, Kyoto (JP); Tadashi Kakeya, Kyoto (JP); Mitsuhiro Kodama, Kyoto (JP); Peng Zhang, Fujian (CN); Zhen Lin, Fujian (CN); Jinhong Yang, Fujian (CN); Wenlian Qian, Fujian (CN); Long Jiang, Fujian (CN)

(73) Assignees: GS Yuasa International Ltd., Kyoto (JP); XIAMEN TUNGSTEN CO., LTD., Xiamen, Fujian (CN)

( * ) Notice: Subject to any disclaimer, the term of this patent is extended or adjusted under 35 U.S.C. 154(b) by 73 days.

(21) Appl. No.: 15/503,942

(22) PCT Filed: Aug. 17, 2015

(86) PCT No.: PCT/CN2015/087227
§ 371 (c)(1),
(2) Date: Feb. 14, 2017

(87) PCT Pub. No.: WO2016/026413
PCT Pub. Date: Feb. 25, 2016

(65) Prior Publication Data
US 2017/0250397 A1    Aug. 31, 2017

(30) Foreign Application Priority Data
Aug. 19, 2014    (CN) .......................... 2014 1 0409393

(51) Int. Cl.
*H01M 4/00* (2006.01)
*H01M 4/24* (2006.01)
(Continued)

(52) U.S. Cl.
CPC ........... *H01M 4/242* (2013.01); *C01B 3/0031* (2013.01); *C01B 3/0057* (2013.01); *C22C 14/00* (2013.01);
(Continued)

(58) Field of Classification Search
CPC ..... H01M 4/242; H01M 4/383; C01B 3/0031; C30B 21/02
See application file for complete search history.

(56) References Cited

U.S. PATENT DOCUMENTS 6,248,475 B1    6/2001  Hayashida et al.
7,829,220 B2 *  11/2010 Yoshida ................ C01B 3/0057
                                                      423/644
(Continued)

FOREIGN PATENT DOCUMENTS

CN    1443861      9/2003
CN    101501896    8/2009
(Continued)

OTHER PUBLICATIONS

International Search Report of PCT/CN2015/087227 dated Dec. 11, 2015.
(Continued)

*Primary Examiner* — Cynthia H Kelly
*Assistant Examiner* — Monique M Wills
(74) *Attorney, Agent, or Firm* — Rankin, Hill & Clark LLP

(57) ABSTRACT

This disclosure provides a hydrogen storing alloy and a production method thereof. The hydrogen storing alloy has a chemical composition of a general formula $R_{(1-x)}Mg_xNi_y$,
(Continued)

wherein R is one or more elements selected from rare earth elements comprising Y, x satisfies $0.05 \leq x \leq 0.3$, and y satisfies $2.8 \leq y \leq 3.8$. The ratio of the maximal peak intensity present in a range of $2\theta=31°\text{-}33°$ to the maximal peak intensity present in a range of $2\theta=41°\text{-}44°$ is 0.1 or less (including 0), as measured by X-ray diffraction in which a Cu—K$\alpha$ ray is set as an X-ray source.

1 Claim, 1 Drawing Sheet

(51) Int. Cl.
*C22C 19/03* (2006.01)
*H01M 4/38* (2006.01)
*C01B 3/00* (2006.01)
*C22C 14/00* (2006.01)
*C22C 21/16* (2006.01)
*C30B 21/02* (2006.01)
*C30B 29/52* (2006.01)
*H01M 8/0606* (2016.01)

(52) U.S. Cl.
CPC .............. *C22C 19/03* (2013.01); *C22C 21/16* (2013.01); *C30B 21/02* (2013.01); *C30B 29/52* (2013.01); *H01M 4/38* (2013.01); *H01M 4/383* (2013.01); *H01M 8/0606* (2013.01); *C01P 2002/70* (2013.01)

(56) References Cited

U.S. PATENT DOCUMENTS

| | | | |
|---|---|---|---|
| 2010/0178561 A1* | 7/2010 | Kakeya | C22C 1/0441 429/218.2 |
| 2011/0229755 A1* | 9/2011 | Sugii | H01M 4/383 429/163 |
| 2013/0213532 A1 | 8/2013 | Kanemoto et al. | |
| 2013/0272918 A1* | 10/2013 | Otsuki | C22C 19/00 420/455 |

FOREIGN PATENT DOCUMENTS

| | | |
|---|---|---|
| CN | 101538660 | 9/2009 |
| CN | 102337438 | 2/2012 |
| CN | 103165873 | 6/2013 |
| EP | 2 628 812 | 8/2013 |
| JP | 2005-142104 | 6/2005 |
| JP | 2005142104 A | 6/2005 |
| JP | 2013-149445 | 8/2013 |
| WO | 03072838 A1 | 9/2003 |

OTHER PUBLICATIONS

European Search Report dated Mar. 2, 2018 for the corresponding European Patent Application No. 15833059.7.

* cited by examiner

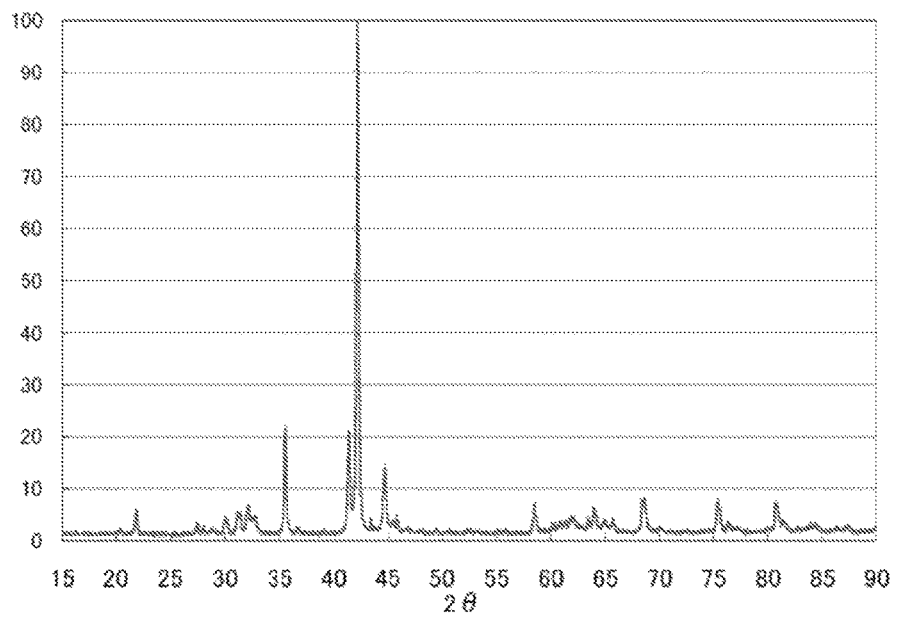

HYDROGEN STORING ALLOY AND PRODUCTION METHOD THEREOF

FIELD OF THE INVENTION

This disclosure relates to a hydrogen storing alloy and a production method thereof.

BACKGROUND OF THE INVENTION

Hydrogen storing alloys used in nickel-hydrogen batteries, etc., are substances providing great effects on the properties of the batteries, such as the discharge capacity and durability. Therefore, various crystalline phases and compositions of hydrogen storing alloys have been studied. In the past, $AB_5$-based hydrogen storing alloys mainly composed of a rare earth element and Ni have been put into practical use. In recent years, for the purpose of high discharge capacity of batteries, the hydrogen storing alloys, which allow alloys comprising a rare earth element and Ni to contain Mg, etc., are being studied. For example, as such hydrogen storing alloys, the hydrogen storing alloys, etc., have been proposed, wherein the intensity ratio of the maximal peak intensity present in a range of $2\theta=31°-33°$ to the maximal peak intensity present in a range of $2\theta=40°-44°$ is 0.1 or more in an X-ray diffraction measurement using a Cu—Kα ray as an X-ray source and the molar ratio of Mg to the total amount of the rare earth element and Mg is 0.3 or more (Patent Literature 1).

However, compared to the existing $AB_5$-based hydrogen storing alloys mainly composed of a rare earth element and Ni, the hydrogen storing alloys described above have a problem that the alloy particles are amenable to be micronized due to charge-discharge cycles. If the alloy particles are micronized, the surface area of particles increases which thereby accelerates the corrosion of alloys, and the cycle life of batteries is reduced. That is, in the batteries using the hydrogen storing alloys described above, a problem of significantly shorter cycle life occurs.

PRIOR ART DOCUMENT

Patent Document

Patent Document 1: JP-A-2005-142104

SUMMARY OR THE INVENTION

Problems To Be Solved By The Disclosure

In view of problems described above, the subject of this disclosure is to provide a micronization-suppressed hydrogen storing alloy and a production method of this hydrogen storing alloy.

Means for Solving the Problems

In order to solve the problems described above, as a result of repeated intensive investigations by the inventor et al., it is found that in an alloy having a specified composition, the micronization accompanying the charge-discharge reaction of the alloy may be suppressed by allowing the intensity of a peak present in a range of $2\theta=31°-33°$ derived from a polytype laminated structure of a hydrogen storing alloy to become smaller.

The hydrogen storing alloy of this disclosure is characterized in that the ratio of the maximal peak intensity present in a range of $2\theta=31°-33°$ to the maximal peak intensity present in a range of $2\theta=41°-44°$ is 0.1 or less and includes 0, as measured by X-ray diffraction in which a Cu—Kα ray is set as an X-ray source.

Preferably, the hydrogen storing alloy is characterized in that the hydrogen storing alloy has a chemical composition of a general formula $R_{(1-x)}Mg_xNi_y$ (R is one or more elements selected from rare earth elements comprising Y, x satisfies $0.05 \leq x \leq 0.3$, and y satisfies $2.8 \leq y \leq 3.8$). Moreover, preferably, the hydrogen storing alloy is characterized in that the hydrogen storing alloy has a chemical composition of $La_{(1-a-b)}Y_aMg_bNi_cAl_d$ (a satisfies $0.12 \leq a \leq 0.15$, b satisfies $0.14 \leq b \leq 0.16$, c satisfies $3.39 \leq c \leq 3.53$, and d satisfies $0.13 \leq d \leq 0.17$).

The production method of a hydrogen storing alloy of this disclosure is characterized by comprising: a melting step of melting a raw material by setting a casting amount of 300-700 kg; a cooling step of quenching a melt obtained in the melting step; and an annealing step of annealing a cooled matter obtained in the cooling step at a temperature in a range of 950° C. or more and below 1000° C.

Preferably, the production method of a hydrogen storing alloy is characterized in that the melt after the melting step has a chemical composition of a general formula $R_{(1-x)}Mg_xNi_y$ (R is one or more elements selected from rare earth elements comprising Y, x satisfies $0.05 \leq x \leq 0.3$, and y satisfies $2.8 \leq y \leq 3.8$). Moreover, preferably, the production method of a hydrogen storing alloy is characterized in that the melt after the melting step has a chemical composition of $La_{(1-a-b)}Y_aMg_bNi_cAl_d$ (a satisfies $0.12 \leq a \leq 0.15$, b satisfies $0.14 \leq b \leq 0.16$, c satisfies $3.39 \leq c \leq 3.53$, and d satisfies $0.13 \leq d \leq 0.17$).

Effects Of The Disclosure

An effect of suppressing micronization is achieved by the hydrogen storing alloy of this disclosure. Furthermore, an effect of being capable of obtaining a hydrogen storing alloy in which micronization is suppressed is achieved by the production method of a hydrogen storing alloy of this disclosure.

BRIEF DESCRIPTION OF THE DRAWINGS

FIG. 1 is a graph representing a result of an X-ray diffraction measurement of a hydrogen storing alloy (Example 2).

DETAILED DESCRIPTION OF THE INVENTION

An embodiment of the hydrogen storing alloy of this disclosure will be illustrated below.

With respect to the hydrogen storing alloy of this embodiment, the ratio of the maximal peak intensity present in a range of $2\theta=31°-33°$ to the maximal peak intensity present in a range of $2\theta=41°-44°$ is 0.1 or less (including 0), as measured by X-ray diffraction in which a Cu—Kα ray is set as an X-ray source.

In the X-ray diffraction measurement of the hydrogen storing alloy, the peak in the range of $2\theta=31°-33°$ is derived from a polytype laminated structure of the hydrogen storing alloy. It is to be indicated that the polytype laminated structure refers to a structure in which a crystal structure formed by laminating two or more kinds of different crystalline phases in the direction of c axis constitutes a crystal grain. Furthermore, the crystalline phase is composed by laminating an $AB_5$ unit and an $A_2B_4$ unit.

The $A_2B_4$ unit refers to a structural unit having a hexagonal $MgZn_2$ type crystal structure (a C14 structure) or a hexagonal $MgCu_2$ type crystal structure (a C15 structure). On the other hand, the $AB_5$ unit refers to a structural unit having a hexagonal $CaCu_5$ type crystal structure.

With respect to the hydrogen storing alloy, in the X-ray diffraction measurement, the ratio of the maximal peak intensity present in a range of $2\theta=31°-33°$ to the maximal peak intensity present in a range of $2\theta=40°-44°$ is 0.1 or less. Therefore, it is considered that the $AB_5$ unit and the $A_2B_4$ unit are randomly arranged in the laminated structure thereof. Thereby, it is considered that the stress caused by the expansion and contraction accompanying a charge-discharge reaction is alleviated and thus the micronization is suppressed.

The hydrogen storing alloy may partly contain various crystalline phases having crystal structures different from each other.

As the crystalline phase, the following may be exemplified: a crystalline phase composed of a rhombohedral $La_5MgNi_{24}$ type crystal structure (also simply referred to as a $La_5MgNi_{24}$ phase below), a crystalline phase composed of a hexagonal $Pr_5Co_{19}$ type crystal structure (also simply referred to as a $Pr_5Co_{19}$ phase below), a crystalline phase composed of a rhombohedral $Ce_5Co_{19}$ type crystal structure (also simply referred to as a $Ce_5Co_{19}$ phase below), a crystalline phase composed of a hexagonal $Ce_2Ni_7$ type crystal structure (also simply referred to as a $Ce_2Ni_7$ phase), a crystalline phase composed of a rhombohedral $Gd_2Co_7$ type crystal structure (also simply referred to as a $Gd_2Co_7$ phase below), a crystalline phase composed of a hexagonal $CaCu_5$ type crystal structure (also simply referred to as a $CaCu_5$ phase below), a crystalline phase composed of a cubic $AuBe_5$ type crystal structure (also simply referred to as a $AuBe_5$ phase below), or the like.

The $La_5MgNi_{24}$ type crystal structure refers to a crystal structure in which 4 parts by unit of $AB_5$ units are inserted between $A_2B_4$ units. The $Pr_5Co_{19}$ type crystal structure refers to a crystal structure in which 3 parts by unit of $AB_5$ units are inserted between $A_2B_4$ units. The $Ce_5Co_{19}$ type crystal structure refers to a crystal structure in which 3 parts by unit of $AB_5$ units are inserted between $A_2B_4$ units. The $Ce_2Ni_7$ type crystal structure refers to a crystal structure in which 2 parts by unit of $AB_5$ units are inserted between $A_2B_4$ units. The $Gd_2Co_7$ type crystal structure refers to a crystal structure in which 2 parts by unit of $AB_5$ units are inserted between $A_2B_4$ units. The $CaCu_5$ type crystal structure refers to a crystal structure only composed of $AB_5$ units. The $AuBe_5$ type crystal structure refers to a crystal structure only composed of $A_2B_4$ units.

The crystal structure of the crystalline phase may be identified by subjecting a pulverized alloy powder to an X-ray diffraction measurement and analyzing the obtained X-ray diffraction pattern with a Rietveld method.

The hydrogen storing alloy is more preferably a hydrogen storing alloy in which two or more crystalline phases described above are laminated in the direction of c axis of this crystal structure.

In the hydrogen storing alloy in which two or more crystalline phases having crystal structures different from each other are laminated in the direction of c axis of this crystal structure, the strain of the crystalline phase upon absorbing hydrogen due to charging of a chargeable battery is alleviated through other adjacent crystalline phases. Therefore, the hydrogen storing alloy described above has the advantage that the micronization of the alloy is more difficult to occur even if the absorption and desorption of hydrogen are repeatedly performed due to charging and discharging.

In the hydrogen storing alloy in which various crystalline phases are laminated in the direction of c axis of the crystal structure, the order of the lamination of respective crystalline phases is not particularly limited. For example, with respect to the hydrogen storing alloy in which various crystalline phases are laminated in the direction of c axis, it may be either a hydrogen storing alloy in which various crystalline phases are combined and periodically and repeatedly laminated, or a hydrogen storing alloy in which various crystalline phases are randomly and non-periodically laminated.

It is further preferable that the hydrogen storing alloy has two or more selected from the $Pr_5Co_{19}$ phase (a crystal structure in which 3 parts by unit of $AB_5$ units are inserted between $A_2B_4$ units), the $Ce_5Co_{19}$ phase (a crystal structure in which 3 parts by unit of $AB_5$ units are inserted between $A_2B_4$ units), and the $Ce_2Ni_7$ phase (a crystal structure in which 2 parts by unit of $AB_5$ units are inserted between $A_2B_4$ units) described above, and has a structure in which the $AB_5$ unit and the $A_2B_4$ unit are laminated in the direction of c axis the crystal structure. By having these crystalline phases, the hydrogen storing alloy has the advantage that it is more difficult to result in micronization caused by repeated absorption and desorption of hydrogen.

The laminated structure of the crystalline phase may be confirmed by observing the image of the lattices in the alloy with a TEM. In particular, it can be confirmed by observing the image of the lattices in the alloy with a TEM that two or more crystalline phases having crystal structures different from each other, for example, are laminated in the direction of c axis of this crystal structure.

The chemical composition of the hydrogen storing alloy is preferably general formula $R_{(1-x)}Mg_xNi_y$ (R is one or more elements selected from rare earth elements comprising Y, x satisfies $0.05 \leq x \leq 0.3$, and y satisfies $2.8 \leq y \leq 3.8$). Furthermore, it is more preferably represented by the chemical composition of general formula $R_{(1-x)}Mg_xNi_yM_z$, wherein M is at least one element selected from Mn, Co, and Al and it satisfies $0 \leq z \leq 0.3$. Furthermore, M is particularly preferably Al. The numerical values represented by using x, y, and z in the chemical composition described above represents the number proportions of respective elements in the hydrogen storing alloy.

With respect to the hydrogen storing alloy, it has the advantage of further suppressing micronization due to being this chemical composition.

The hydrogen storing alloy is particularly preferably $La_{(1-a-b)}Y_aMg_bNi_cAl_d$ (a satisfies $0.12 \leq a \leq 0.15$, b satisfies $0.14 \leq b \leq 0.16$, c satisfies $3.39 \leq c \leq 3.53$, and d satisfies $0.13 \leq d \leq 0.17$). The numerical values represented by using a, b, c, and d in the chemical composition described above represents the number proportions of respective elements in the hydrogen storing alloy.

With respect to the hydrogen storing alloy, it has the advantage of further suppressing micronization due to being this composition range.

In the hydrogen storing alloy, the B/A ratio is preferably 3.3 or more and 3.6 or less. It is considered that the B/A ratio of the hydrogen storing alloy is allowed to be 3.3 or more and 3.6 or less such that further micronization is difficult even if the expansion and contraction of the crystalline phase occurs and the structure of crystalline phase is more stabilized. Therefore, the cycle characteristic of alkaline storage batteries using the hydrogen storing alloy becomes more excellent.

It is to be indicated that A in the B/A ratio represents an element selected from Mg, Ca, and the rare earth elements comprising Y.

Furthermore, B in the B/A ratio represents an element selected from 6A Group elements, 7A Group elements, the transition metal elements including 8 Group elements (except Pd), 1B Group elements, 2B Group element or the like, and Al.

It is to be indicated that the hydrogen storing alloy having a chemical composition represented by the general formula described above may contain elements which are not specified in this general formula as impurities.

Hereafter, the production method of a hydrogen storing alloy of this embodiment will be illustrated below.

The production method of a hydrogen storing alloy of this embodiment comprises:

a melting step of melting a raw material by setting a casting amount of 300-700 kg;

a cooling step of quenching a melt obtained in the melting step; and an annealing step of annealing a cooled matter obtained in the cooling step at a temperature in a range of 950° C. or more and below 1000° C.

Specifically, in the production method of a hydrogen storing alloy of this embodiment, for example, the following steps are performed: a melting step of melting an alloy raw material compounded in a manner of becoming the chemical composition specified above; a cooling step of cooling a melt of a melted raw material; an annealing step of annealing the cooled matter obtained in the cooling step under an atmosphere of an inactive gas; and a pulverizing step of pulverizing the alloy obtained in the annealing step. Thereafter, a hydrogen storing alloy is obtained.

In the melting step, a specified amount of a raw material ingot (a raw material) is first weighed such that the chemical composition of the hydrogen storing alloy becomes the composition of interest.

In the melting step, the alloy raw material weighed is then placed in a crucible. The casting amount in this disclosure is 300-700 kg. The casting amount in this disclosure refers to the weight when the raw material ingot is weighed, which is the weight of the alloy melted in one melting step. It is to be indicated that it fails to obtain an alloy achieving the effect of this disclosure if the casting amount is 300 kg or less and it is difficult to obtain a uniform alloy if the casting amount is 700 kg or more. Moreover, from the viewpoint of stably obtaining an alloy, the casting amount is preferably 400-650 kg, and more preferably 500-600 kg. Thereafter, the alloy raw material is heated in an atmosphere of an inactive gas or in vacuum at a temperature of 1200° C. or more and 1650° C. or less which exceeds the melting point of the alloy to melt the alloy raw material.

In the cooling step, the melt formed by melting the alloy raw material is solidified by quenching.

Quenching refers to cooling the melt formed by melting the alloy raw material at a cooling speed of 1000K/second or more. The composition of the alloy is more uniform by cooling at 1000K/second or more. Furthermore, the cooling speed of quenching may be set to 1000000K/second or less.

The cooling method of the cooling step is a melt spinning method, and the cooling apparatus has a metal roll. With respect to the circumstance where a metal roll is used, it is preferred due to the excellent cooling efficiency.

In the annealing step, annealing is performed at a temperature of 950° C. or more and below 1000° C.

In the annealing step, if the annealing is performed at a temperature below 950° C., then the crystalline phase and the chemical composition of the alloy vary, which may bring out extremely bad effects to the absorption and desorption properties of hydrogen. Furthermore, if the annealing is performed at 1000° C. or more, then the alloy is melted and thus it may fail to achieve the object of annealing.

The atmosphere of the annealing step is not particularly limited. That is, the annealing step may be performed either under an atmosphere of inactive gas or in a vacuum state.

The pressure condition in the annealing step is not particularly limited. As this pressure condition, for example, a pressurized condition which exceeds the standard atmospheric pressure may be used. Furthermore, as the pressure condition, a reduced-pressure condition which is below the standard atmospheric pressure may also be used.

The time of annealing in the annealing step is typically 3 hours or more and 50 hours or less.

In the pulverizing step, a typical pulverization method may be used. In particular, in the pulverizing step, a pulverization method, for example, a mechanical pulverization, a hydrogenation pulverization, etc., may be used.

With respect to pulverization in the pulverizing step, in order to prevent the surface oxidization of the particle-like alloy which is newly generated by pulverization, it is preferably performed in an inactive atmosphere.

The pulverizing step is preferably performed in a manner of allowing the average particle diameter of the pulverized hydrogen storing alloy particles to be 20-70 μm.

It is to be indicated that the hydrogen storing alloy of this embodiment may contain the elements which are not specified in this general formula to the extent that the effects of this disclosure are not impaired even when represented by the general formula of the above chemical composition, as long as this general formula is satisfied.

EXAMPLES

This disclosure will be illustrated in more detail below by way of Examples, but this disclosure is not limited thereto.

Example 1

A hydrogen storing alloy was produced by using the method illustrated below.

First, in the melting step, a specified amount of a raw material ingot was weighed in a manner of allowing the chemical composition to be $La_{0.72}Y_{0.13}Mg_{0.15}Ni_{3.48}A0.15$, and placed in a crucible. The raw material ingot weighed was then heated to 1500° C. and melted under an atmosphere of reduced-pressure argon gas using a high-frequency melting furnace. The casting amount in the melting step was set to 550 kg.

A cooling step was performed after the melting step. In the cooling step, the melt of the alloy raw material was quenched and solidified by using a melt spinning method which used a cooling roll.

In the next annealing step, the cooled alloy was subjected to heat treatment at 950° C. for 7 hours in a reduced-pressure state of 0.05 MPa (absolute pressure value, the same shall apply hereinafter), and annealing was thereby performed. In the next pulverizing step, the alloy pieces obtained via the annealing step was pulverized such that the average particle diameter (D50) was 50 μm.

Examples 2 and 3 and Comparative Examples 1-6

The alloys of Examples 2 and 3 and Comparative Examples 1-6 were produced by the same operations as Example 1 except that the chemical composition after the melting step, the casting amount in the melting step, and the temperature of the heat treatment in the annealing step were changed, as shown in Table 1.

The chemical compositions of the hydrogen storing alloys produced in Examples and Comparative Examples were analyzed, and the results were shown in Table 1. The numeric values in the chemical composition of Table 1 represented the number proportions of respective elements in the hydrogen storing alloy.

Furthermore, the pressure conditions and the temperature conditions of the annealing step in the production of the hydrogen storing alloys in Examples and Comparative Examples were shown in Table 1.

<Structure Analysis of Crystalline Phases Using X-Ray Diffraction>

Structure analysis was performed on the hydrogen storing alloys in Examples and Comparative Examples using an X-ray diffraction measurement.

Specifically, after the hydrogen storing alloy obtained was pulverized with a mortar, the pulverized alloy was measured using a powder X-ray diffraction apparatus (manufactured by Rigaku Corporation, MiniflexII). The measurement conditions were set to the conditions: the radius of measuring angle: 185 mm; divergence slit: 1 deg.; scattering slit: 1 deg.; receiving slit: 0.15 mm; X-ray source: Cu—K$\alpha$ ray; tube voltage: 50 kV; tube current: 200 mA. It is to be indicated that the diffraction angle is in a range of $2\theta=15.0$-$85.0°$, the counting time is 2 seconds, and the stepping scanning is $0.020°$. Structure analysis was performed by a Rietveld method (RIETAN2000 as an analytical software) based on the results obtained by X-ray diffraction.

In the X-ray diffraction measurements of Examples and Comparative Examples, the ratios of the maximal peak intensity present in a range of $2\theta=31°$-$33°$ to the maximal peak intensity present in a range of $2\theta=41°$-$44°$ were shown in Table 1.

Furthermore, the results (diffraction peaks) of the X-ray diffraction measurement performed on the hydrogen storing alloy of Example 2 were shown in FIG. 1 respectively.

(Production of Hydrogen Storing Alloy Electrode)

The alloy powder of each of Examples 1-3 and Comparative Examples 1-6 was mixed with a dispersion of styrene-butadiene rubber (SBR) and an aqueous solution of methylcellulose (MC) to produce a hydrogen storing alloy paste. 1 μm-thick nickel plating was performed on a Fe base material with a thickness of 35 μm, the base material obtained was coated with this paste and dried to produce a raw plate. The raw plate was cut to a size of 30 mm×33 mm to produce a hydrogen storing alloy electrode (negative electrode) having an electrode capacity of 500 mAh or more.

(Production of a Battery for Evaluation)

A sintered-type electrode (nickel: 90 mass %; cobalt: 5 mass %; and zinc: 5 mass %) having a capacity which was 4 times that of the negative electrode is used to sandwich respective hydrogen storing alloys in a state of being separated by a polyolefin separator, and a bolt is then used for fixing in a state of applying a pressure of 1 kgf/cm$^2$. Thereby, an open-type nickel-hydrogen battery having a positive electrode with excessive capacity was assembled. As an electrolytic solution, a 6.8 mol/L KOH solution was used.

(The Charge-Discharge Conditions of the Battery for Evaluation and Magnetic Susceptibility Measurement of the Alloy After Charging and Discharging)

In a sink at 20° C., 10 cycles of 150% charge under 0.1 ItA (31 mA/g) and discharge (where the termination potential of the negative electrode was up to –0.6V (vs.Hg/HgO)) under 0.2 ItA were repeated on the battery for evaluation produced above. 40 cycles of 105% charge under 1ItA and discharge (where the termination potential of the negative electrode is up to -0.6V (vs.Hg/HgO)) under 1 ItA were further repeated. According to the conditions described above, 50 cycles of charging and discharging were performed in total.

The hydrogen storing alloy electrode was withdrawn from the battery for evaluation after the charging and discharging, washed, and then subjected to a magnetic susceptibility measurement using a magnetic susceptibility meter (BHV-10H manufactured by Riken Electronics) and applying a magnetic field of 5000 oersteds.

The results of the magnetic susceptibilities of the negative electrode active substances measured after charging and discharging in the nickel-hydrogen batteries using the hydrogen storing alloys of Examples and Comparative Examples were shown in Table 1.

TABLE 1

| | Alloy composition/at. % | | | | | Ratio of maximal peak intensities | Casting amount/ kg | Temperature in annealing step/° C. | Magnetic susceptibility after charging and discharging/ emu · g$^{-1}$ |
|---|---|---|---|---|---|---|---|---|---|
| | La | Y | Mg | Ni | Al | | | | |
| Comparative Example 1 | 0.717 | 0.13 | 0.153 | 3.48 | 0.15 | 0.32 | 5 | 950 | 5.00 |
| Example 1 | 0.717 | 0.13 | 0.153 | 3.48 | 0.15 | 0.10 | 550 | 950 | 4.57 |
| Comparative Example 2 | 0.717 | 0.13 | 0.153 | 3.48 | 0.15 | 0.38 | 5 | 975 | 5.25 |
| Example 2 | 0.717 | 0.13 | 0.153 | 3.48 | 0.15 | 0.07 | 550 | 975 | 4.68 |
| Comparative Example 3 | 0.717 | 0.13 | 0.153 | 3.48 | 0.15 | 0.36 | 550 | 1000 | 5.11 |
| Comparative Example 4 | 0.747 | 0.10 | 0.153 | 3.48 | 0.15 | 0.40 | 550 | 975 | 5.05 |
| Comparative Example 5 | 0.687 | 0.16 | 0.153 | 3.48 | 0.15 | 0.18 | 550 | 975 | 5.04 |
| Comparative Example 6 | 0.706 | 0.13 | 0.164 | 3.48 | 0.15 | 0.23 | 550 | 975 | 5.00 |
| Example 3 | 0.728 | 0.13 | 0.142 | 3.48 | 0.15 | 0.08 | 550 | 975 | 4.90 |

It can be known from Table 1 that in the nickel-hydrogen battery produced by using the hydrogen storing alloy below as a negative electrode active substance, the magnetic susceptibility after charging and discharging was less than 5.00 emu/g and excessive corrosion of alloy particles was suppressed, wherein with respect to the hydrogen storing alloy, the ratio of the maximal peak intensity present in a range of $2\theta=31°-33°$ to the maximal peak intensity present in a range of $2\theta=41°-44°$ was 0.1 or less, as measured by X-ray diffraction. The occurrence of excessive corrosion implied that the alloy was micronized. Therefore, it can be known that the micronization of the alloys in Examples 1-3 was suppressed.

What is claimed is:

1. A hydrogen storing alloy, wherein the ratio of the maximal peak intensity present in a range of $2\theta=31°-33°$ to the maximal peak intensity present in a range of $2\theta=41°-44°$ is 0.1 or less and includes 0, as measured by X-ray diffraction in which a Cu—K$\alpha$ ray is set as an X-ray source, wherein the hydrogen storing alloy has a chemical composition of $La_{(1-a-b)}Y_aMg_bNi_cAl_d$, wherein a satisfies $0.12 \leq a \leq 0.15$, b satisfies $0.14 \leq b \leq 0.16$, c satisfies $3.39 \leq c \leq 3.53$, and d satisfies $0.13 \leq d \leq 0.17$.

* * * * *